United States Patent
Iwasa

(10) Patent No.: US 6,713,755 B1
(45) Date of Patent: Mar. 30, 2004

(54) SEMICONDUCTOR DEVICE INCLUDING A LIGHT-RECEIVING ELEMENT AND AN OPTICAL TRANSFER DEVICE

(75) Inventor: Yoshiro Iwasa, Matsumoto (JP)

(73) Assignee: Seiko Epson Corporation, Tokyo (JP)

( * ) Notice: Subject to any disclaimer, the term of this patent is extended or adjusted under 35 U.S.C. 154(b) by 117 days.

(21) Appl. No.: 09/654,550

(22) Filed: Sep. 1, 2000

(30) Foreign Application Priority Data

Sep. 6, 1999  (JP) .......................... 11-252252
Aug. 11, 2000 (JP) .......................... 2000-243735

(51) Int. Cl.⁷ .................................. G01J 5/08
(52) U.S. Cl. ..................... 250/227.11; 385/14; 257/81
(58) Field of Search ................. 250/227.11, 214.1; 385/14, 15, 49, 88–94; 257/80–85, 432

(56) References Cited

U.S. PATENT DOCUMENTS

| 5,009,476 A | * | 4/1991  | Reid et al. ................ 385/14 |
| 5,119,451 A | * | 6/1992  | Wills et al. ............ 250/227.11 |
| 5,159,700 A | * | 10/1992 | Reid et al. ................ 385/14 |
| 5,199,087 A | * | 3/1993  | Frazier ................... 257/432 |
| 5,250,816 A | * | 10/1993 | Kitamura .................. 257/81 |
| 5,371,822 A | * | 12/1994 | Horwitz et al. ............. 385/89 |
| 5,442,475 A | * | 8/1995  | Bausman et al. ........... 359/140 |
| 5,757,989 A | * | 5/1998  | Yoshimura et al. .......... 385/14 |
| 5,834,841 A | * | 11/1998 | Suzuki ................... 257/433 |
| 6,259,840 B1 | * | 7/2001  | Munoz-Bustamante et al. . 385/14 |

FOREIGN PATENT DOCUMENTS

| JP | 63-237486 | 10/1988 |
| JP | 64-009667 | 1/1989  |
| JP | 3-142866  | 6/1991  |
| JP | 7-131063  | 5/1995  |

\* cited by examiner

Primary Examiner—Thanh X Luu
(74) Attorney, Agent, or Firm—Hogan & Hartson, LLP

(57) ABSTRACT

A semiconductor device that is capable of correctly transferring signals at high speed. The semiconductor device includes a semiconductor chip, a light-receiving element formed in the semiconductor chip for receiving an optical signal, and a glass fiber as an optical signal transfer device connected to the light-receiving element for transferring the optical signal into the semiconductor chip. Optical signals have a smaller attenuation of signal amplitude and have a higher transfer speed compared to electrical signals. Therefore, by transferring signals in the form of optical signals, the semiconductor device that can correctly transfer signals at high speed is obtained.

3 Claims, 3 Drawing Sheets

SEMICONDUCTOR DEVICE INCLUDING A LIGHT-RECEIVING ELEMENT AND AN OPTICAL TRANSFER DEVICE

BACKGROUND OF THE INVENTION

The present invention relates to a semiconductor device, and more particularly to a semiconductor device that is capable of correctly transferring signals at high speed.

Conventionally, a wiring pattern of printed conductor lines and the like is formed an a product system substrate. A plurality of semiconductor chips are mounted an the system substrate, and electrode pads are formed on the semiconductor chips for transferring electric signals. The electrode pads are electrically connected to lead frames by bonding wires. The semiconductor chip, the bonding wires and one end of the lead frames are sealed with resin. On the other hand, the other end of the lead frames is connected to the wiring pattern by soldering or pressure bonding. Electrical signals are transferred (inputted and outputted) between the semiconductor chips through the wiring pattern and the lead frames.

In the conventional semiconductor device described above, digital signals are generated by turning ON and OFF of electrical signals, and such signals are transferred.

As a result, there an problems in that the semiconductor device is likely to be affected by noises that may result from factors such as higher frequency, higher operation speed and lower voltage (2V) operation. Also, malfunctions may possibly occur due to other factors such as voltage fluctuations.

Furthermore, in the conventional semiconductor device described above, portions of the lead sections that protrude from the mold resin (i.e., the semiconductor package) are connected to the wiring pattern on the system substrate by soldering or pressure bonding, and electrical signals that are transferred by the wiring pattern are inputted in or outputted from the semiconductor chips.

As a result, the electrical signals are substantially influenced by physical properties of transfer elements (physical properties of copper or the like) of the wiring pattern. Therefore, there is a problem in that it is difficult to continuously maintain the original characteristics of the signals. In other words, harmful effects may be created by the influences of the physical properties of adjacent wirings, such as wiring capacitance and the like. As a result, for example propagating signals may be blunted, their amplitudes may become unstable, and devices in succeeding stages may malfunction.

In particular, circuits for clock signals that are inputted in and outputted from the semiconductor device must be designed in consideration of the harmful effects. Also, since electrical influences among adjacent signal lines cannot be ignored. Malfunction protection circuits and other signal controls may need to be implemented. Moreover, the leads that protrude from the semiconductor package have a limited degree of freedom with respect to their length and positions, and therefore, the leads can only be connected to limited areas on the system substrate.

SUMMARY OF THE PREFERRED EMBODIMENTS

Therefore, it is an object of the present invention to provide a semiconductor device that can accurately transmit signals at high speed.

In accordance with one embodiment of the present invention, a semiconductor device includes a semiconductor chip, a light-receiving element formed on the semiconductor chip for receiving optical signal, and an optical signal transfer device connected to the light-receiving element for transferring the optical signal into the semiconductor chip.

In accordance with this embodiment, the optical signal transfer device is connected to the semiconductor chip through the light-receiving element, such that optical signals are used as signals that are inputted in the semiconductor chip. Optical signals have a smaller attenuation of signal amplitude and have a higher transfer speed compared to electrical signals. Therefore, correct signal transfer becomes possible, and thus signals can be correctly transferred at high speed.

The optical signal transfer device may be formed from an optical fiber, such as, for example, a glass fiber.

Also, the semiconductor device may further include a package that seals the semiconductor chip and a portion of the optical fiber.

Also, the semiconductor chip may be mounted on a mounting substrate.

Also, in accordance with another embodiment of the present invention, a semiconductor device includes a mounting substrate, an optical signal transfer device disposed in the mounting substrate for transferring optical signals, a plurality of semiconductor chips mounted on the mounting substrate, and a light-receiving element connected to the optical signal transfer device for receiving optical signals, wherein signals are transferred among the plurality of semiconductor chips by the optical signal transfer device.

Furthermore, in accordance with another embodiment of the present invention, a semiconductor device includes a semiconductor chip, a light-receiving element formed on the semiconductor chip for receiving optical signals, and an optical signal transfer device connected to the light-receiving element for transferring signals from an arithmetic processing apparatus as optical signals into the semiconductor chip.

In accordance with this embodiment, the optical signal transfer device is connected to the semiconductor chip through the light-receiving element, such that optical signals are used as signals that are inputted from the arithmetic processing apparatus in the semiconductor chip. Optical signals have a smaller attenuation of signal amplitude and have a higher transfer speed compared to electrical signals. Therefore, correct signal transfer becomes possible, and thus signals can be correctly transferred at high speed.

In particular, when clock signals are used as signals that are inputted from the arithmetic processing apparatus in the semiconductor chip, phase shift in the clock signals can be avoided, and highly accurate clock signals can be transferred to the semiconductor chip.

Also, the optical signal transfer device may be provided in a mounting substrate on which the semiconductor chip is mounted. For example, the optical signal transfer device may be embedded in the mounting substrate.

Also, a light-emitting element surface that is formed on the mounting substrate or within the mounting substrate may, be used as the optical signal transfer device. In other words, for example, the light-emitting element surface is formed on the mounting substrate, such that the entire surface of the mounting substrate may irradiate light in response to inputted optical signals. As a result, the optical signal transfer device can be disposed anywhere in the mounting substrate without regard to the mounting location of the semiconductor chip within the mounting substrate.

Alternatively, instead of forming a light-emitting element surface over the entire surface of the mounting substrate, the optical signal transfer device may be formed in a lattice configuration, and disposed in the mounting substrate.

In this instance, the light-receiving element in a convex shape may be formed on the semiconductor chip on a side thereof that is opposite to the mounting substrate. The light-receiving element may be inserted in the optical signal transfer device that is disposed in a plane configuration or a lattice configuration to thereby connect the light-receiving element to the optical signal transfer device. As a result, the light-receiving element and the optical signal transfer device can be readily and securely connected to each other.

DESCRIPTION OF PREFERRED EMBODIMENTS

Embodiments of the present invention are described below with reference to the accompanying drawings.

Figure 1:
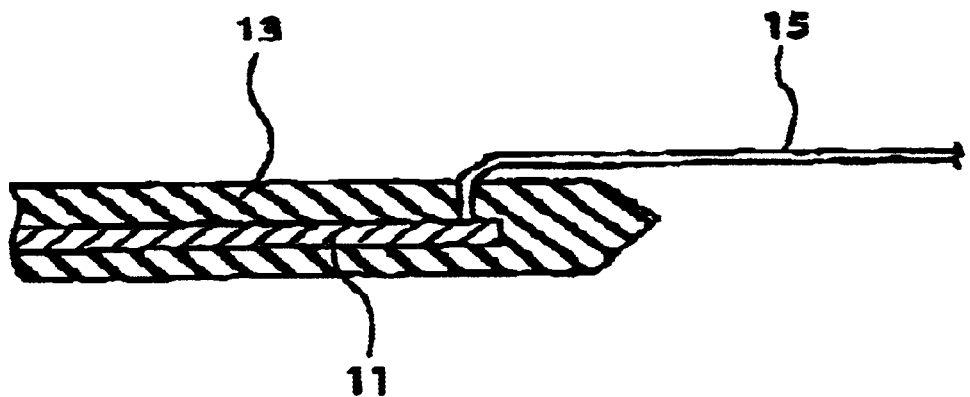
FIG. 1 is a cross-sectional view in part of a semiconductor device in accordance with a first embodiment of the present invention.

FIG. 1 is a cross-sectional view in part of a semiconductor device in accordance with a first embodiment of the present invention.

The semiconductor device has a semiconductor chip 11. A light-receiving element (not shown) is formed on the semiconductor chip 11 for receiving optical signals carried on a laser beam (infrared light) or the like. The light-receiving element is connected to one end of an optical signal transfer device, such as, for example, a glass fiber 15 that is a directional element by a light-transmissive type adhesive. The optical signal transfer device transfers optical signals into the semiconductor chip 11. The semiconductor chip 11, the light-receiving element and one end of the glass fiber 15 are sealed by molding resin 13.

In the semiconductor device described above, optical signals are guided from the glass fiber 15 through the light-receiving element into the semiconductor chip 11. In other words, the optical signals are handed over by the light-receiving element and introduced in the semiconductor chip 11.

In accordance with the first embodiment of the present invention, the glass fiber 15 is connected to the semiconductor chip 11 through the light-receiving element, and optical signals carried by laser are used as signals that are inputted in the semiconductor chip 11. Optical signals have a smaller attenuation of signal amplitude and have a higher transfer speed compared to electrical signals. Therefore, accurate signal transfer becomes possible, and thus signals can be correctly transferred at high speed with substantially no effects by the physical property (transmission property) of the glass fiber 15 that is an optical signal transfer devise.

Also, optical signals are difficult to be affected by noises than electrical signals, and therefore malfunctions that may be cause by voltage fluctuations are also difficult to occur. Furthermore, optical signals are not affected by the physical properties of a transfer element such as the glass fiber 15, and can continuously maintain the original characteristics of the signal.

Also, optical signals do not become blunt due to the influences of the physical properties existing among the adjacent glass fibers, and their amplitudes do not become unstable.

In the first embodiment described above, one end of the glass fiber 15 and the light-receiving element are connected by a light transmissive type adhesive. However, one end of the glass fiber 15 and the light-receiving element can be connected by pressure bonding by molding.

Figure 2:
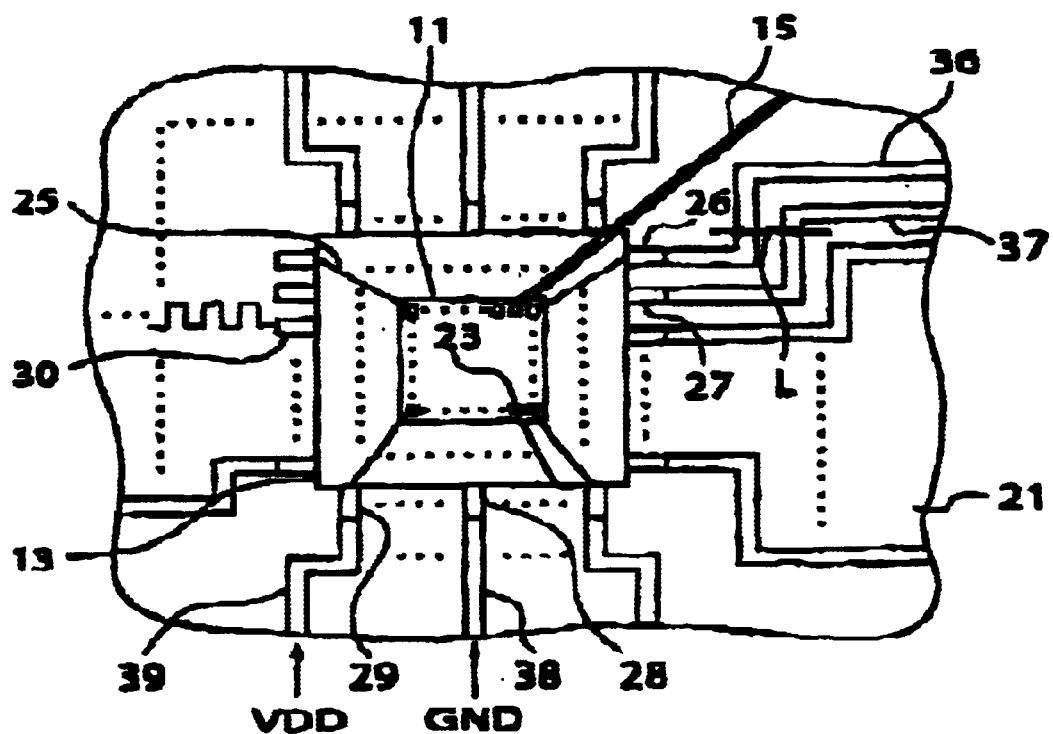
FIG. 2 is a cross-sectional view in part of a semiconductor device in accords with a second embodiment of the present invention.

FIG. 2 is a cross-sectional view in part of a semiconductor device in accordance with a second embodiment of the present invention, in which the semiconductor chip 11 shown in FIG. 1 is mounted on a system substrate that is a mounting substrate.

A plurality of electrode pads 23 are formed on a surface of the semiconductor chip 11. Part of the electrode pads 23 are electrically connected to leads 26 through 30 by bonding wires. Another part of the electrode pads 23 is connected to one end of the glass fiber 15 as an optical signal transfer device through the light-receiving element. The semiconductor chip 11, the bonding wires 25, a part of the leads and one end of the glass fiber 15 are sealed by the molding resin 13.

Wiring patterns 36–39 of conductive lines are printed on the system substrate 21. Also, a semiconductor package 13 is mounted on the system substrate 21. Portions of the leads 26–30 that protrude from the semiconductor package 13 are connected to the wiring patterns 36–39 by soldering or pressure bonding.

In the semiconductor device described above, optical signals are inputted through the glass fiber 15, and the optical signals are changed into electrical signals within the semiconductor chip 11. For example, it is possible to set such that a power supply potential $V_{DD}$ is supplied from a power source to a signal line that supplies electrical signals that have been converted from optical signals in response to an optical signal ON, and a ground potential is supplied to the signal line in response to an optical signal OFF.

The second embodiment can produce effects similar to those of the first embodiment.

Also, in the second embodiment, the glass fiber 15 is connected to the semiconductor chip 11. As a result, the degree of freedom in disposing the circuit elements is improved compared with a device using only leads. More specifically, portions of the leads that protrude from the semiconductor package 13 have fixed length and are disposed at fixed locations, such that the loads can be connected to the wiring patterns at limited locations on the system substrate 21. Also, a gap L between the wiring patterns 36 and 37 on the system substrate 21 needs to be greater than a specified amount. Accordingly, the circuit structure is restricted when only the leads and the wiring patterns are used. However, when the glass fiber 15 is additionally used as a means to supply signals to the semiconductor chip 11, the degree of freedom in disposing the circuit components is improved.

Also, a gap between the adjacent leads (pins) needs to be greater than a specified amount. Since the number of the pins cannot limitlessly be increased, the circuit structure is restricted. However, the additional use of the glass fiber 15 as a means to supply signals to the semiconductor chip 11 improves the degree of freedom in disposing the circuit components.

It is noted that, in the second embodiment, one glass fiber 15 is connected to the semiconductor chip 11. However, a plurality of class fibers may be connected to the semiconductor chip, and the glass fibers can be disposed at any locations.

Figure 3:
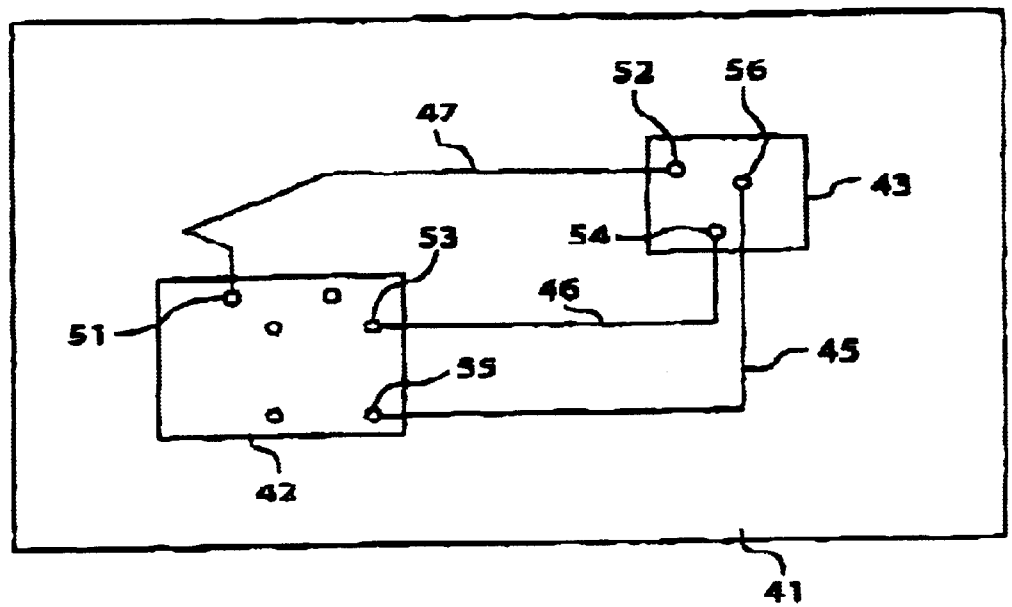
FIG. 3 schematically shows a plan view of a semiconductor device in accordance with a third embodiment of the present invention.

FIG. 3 schematically shows a plan view of a semiconductor device in accordance with a third embodiment of the present invention.

Directional elements such as glass fibers 45–47 are disposed in a system substrate 41 as a means to transfer optical signals. A plurality of semiconductor chips 42 said 43 are mounted on the system substrate 41. Light-receiving elements for receiving optical signals carried on a laser beam (infrared light) or the like and light-emitting elements for emitting optical signals 51–56 are formed on the semiconductor chips 42 and 43.

The semiconductor chips 42 and 43 are connected to each other by the glass fibers 45–47 through the light-receiving elements and light-emitting elements 51–56. The glass fibers are used in the same manner as wirings such as conduction wirings.

More specifically, one end of the glass fiber 47 is connected to the semiconductor chip 42 through the light-receiving element 51, and the other end of the glass fiber 47 is connected to the semiconductor chip 43 through the light-emitting element 52, such that signals are outputted from the semiconductor chip 43 to the light source semiconductor chip 42. Also, one end of the glass fiber 46 in connected to the semiconductor chip 42 through the light-receiving element 53, and the other end of the glass fiber 46 is connected to the semiconductor chip 43 through the light-emitting element 54. One end of the glass fiber 45 is connected to the semiconductor chip 42 through the light-emitting element 55, and the other end of the glass fiber 45 is connected to the semiconductor chip 43 through the light-receiving element 56, such that signals are outputted from the semiconductor chip 42 to the semiconductor chip 43.

In the semiconductor device described above, optical signals are transferred between the semiconductor chips 42 and 43 through the glass fibers 45–47 and the light-receiving elements 51–56. In other words, optical signals are handed over and introduced in the semiconductor chips 42 and 43 by the light-receiving elements 51–56.

Therefore, the third embodiment provides effects similar to those provided by the first embodiment.

In particular, when clock signals are transferred between an arithmetic processor apparatus and a memory apparatus, the embodiment provides favorable effects because a phase shift does not occur in the clock signal.

Also, in accordance with the third embodiment, wirings with a directional material such as glass fibers 45–47, as a wiring material for connecting semiconductor products, are pre-installed within the system substrate 41. Therefore, lead sections that are typically used in a conventional semiconductor device are not required. Accordingly, malfunctions of the device that may be caused by defective soldering can be prevented.

Figure 4:
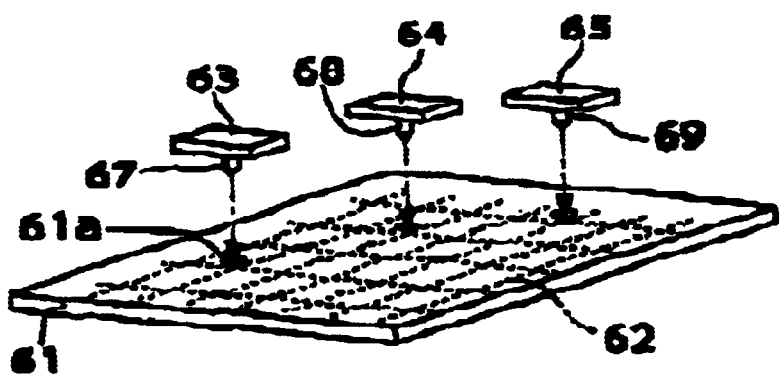
FIG. 4 schematically shows a plan view of a semiconductor device in accordance with a fourth embodiment of the present invention.

FIG. 4 shows a semiconductor device in accordance with a fourth embodiment of the present invention.

In the fourth embodiment, a system substrate 61 is formed from a film substrate, for example. Glass fibers 62 as an optical signal transfer device are connected in a lattice structure and embedded in the system substrate 61. When a signal is generated at any location of the glass fibers 62, the signal can be propagated through the entire area of the glass fibers 62. When the system substrate 61 is formed, the glass fibers 62 are embedded in the system substrate 61.

Figure 5:
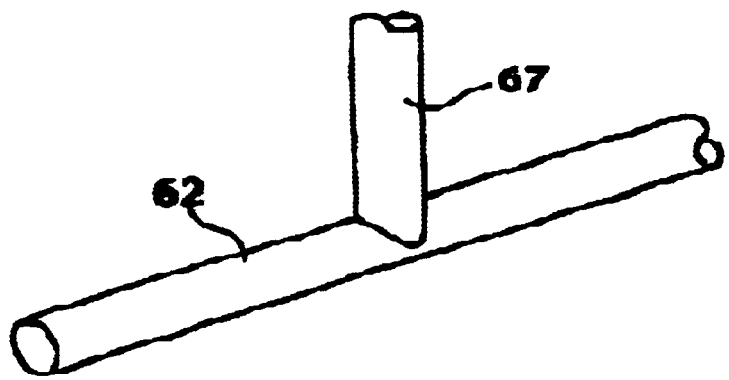
FIG. 5 is a view for illustrating a method for connecting a light-emitting element or a light-receiving element with a glass fiber.

An arithmetic processor apparatus 63 is mounted on the system substrate 61. A light-emitting element 67 to transferring a clock signal is formed on the arithmetic processor apparatus 63. There are provided semiconductor chips such as storage apparatuses 64 and 65 that receive clock signals from the arithmetic process apparatus 63. Light-receiving elements 68 and 69 are formed on the storage apparatuses 64 and 65 for receiving optical signals carried on laser beam (infrared light) or the like. Contact holes 61a are formed in the system substrate 61 that is formed with the glass fibers 62 described above at locations where the semiconductor chips 63–65 are mounted and in a manner that the contact holes 61a are located opposite to the light-receiving elements or the light-emitting elements 67–69. Then, the light-receiving elements and light-emitting elements 67–69 are inserted in the contact holes 61a, and the light-receiving elements and light-emitting elements 67–69 are pressure bonded to the glass fibers 62, as shown in FIG. 5, to thereby connect the light-receiving elements and light-emitting elements 67–69 to the glass fibers 62.

As a result, the semiconductor chips 63–65 are connected to the glass fibers 62 through the light-receiving elements and light-emitting elements 67–69. Clock signals from the semiconductor chip 63 that is an arithmetic processor apparatus are transferred through the light-emitting element 67 to the glass fibers 62, and the semiconductor chips 64 and 65 receive the signals transmitted through the glass fibers 62 at their respective light-receiving elements 68 and 69. As a result, the clock signals are taken into the storage apparatuses 64 and 65 from the glass fibers 62.

Signals other than the clock signals may be transferred by wiring patterns that may be formed on the system substrate 61, for example.

Accordingly, this embodiment also provides effects similar to those provided by the embodiments described above. Also, in the semiconductor device of the present embodiment, the glass fiber 62 in a lattice configuration are formed in the system substrate 61. Therefore, when the system substrate 61 is formed, glass fibers 62 do not need to be embedded in consideration of factors such as locations of semiconductor chip to be mounted on the system substrate 61. As a result, the system substrate 61 can be readily manufactured.

Also, since the system substrate 61 is formed by a film substrate, the system substrate 61 can be bent to a degree, and the cost can be lowered.

It is noted that the fourth embodiment is described with reference to a structure in which the glass fibers 62 are formed through the entire area of the system substrate 61. However, the present invention is not limited to this embodiment. For example, the glass fibers 62 may be formed in a limited area in the system substrate 61, for example, in an area where the semiconductor chip is mounted.

Also, the smaller the gap of the lattice becomes, the less the position of the glass fibers needs to be considered when the semiconductor chip is mounted. However, the lattice gap may be determined depending on separations among the semiconductors chips that are mounted on the substrate.

Figure 6:
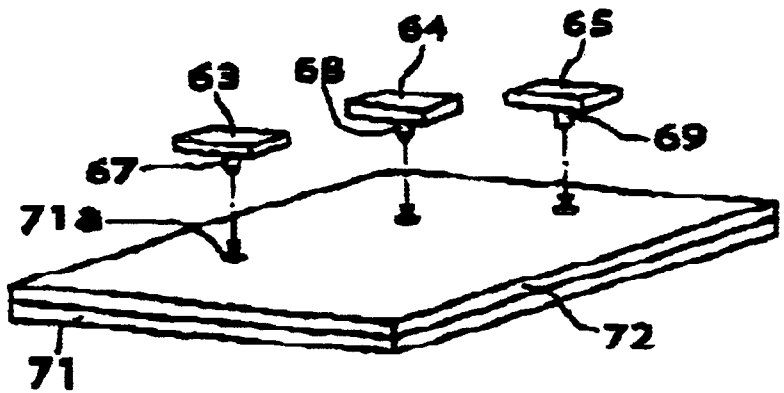
FIG. 6 schematically shows a plan view of a semiconductor device in accordance with a fifth embodiment of the present invention.

FIG. 6 shows a semiconductor device in accordance with a fifth embodiment of the present invention.

In accordance with the fifth embodiment of the present invention, a system substrate 71 is used instead of the system substrate 61 used in the apparatus of the fourth embodiment.

The system substrate 71 of the fifth embodiment is formed from a film substrate, and a light-emitting surface 72 composed of light-emitting elements such as light-emitting diodes formed on the system substrate 71. A light prevention film is formed on the light-emitting surface 72 for preventing external light from entering into the light-emitting surface 72.

It is noted that the light-emitting surface 72 may be formed within the system substrate 71. Alternatively, the system substrate 71 may be formed from light-emitting elements, and the system substrate 71 may be used as the light-emitting surface 72.

Contact holes 71a an formed in the system substrate 71 at locations where the semiconductor chips 63–65 are mounted in a manner that the contact holes 71a are disposed opposite to the light-receiving elements or light-emitting elements 67–69. The light-receiving elements and light-emitting elements 67–69 are inserted in the contact holes 71a, and the light-receiving elements and light-emitting elements 67–69 are pressure bonded to the light-emitting surface 72 to thereby connect the light-receiving elements and light-emitting elements 67–69 to the light-emitting surface 72.

As a result, the semiconductor chips 63–65 on connected to the light-emitting surface 72 through the light-receiving elements and light-emitting elements 67–69. Clock signals from the semiconductor chip 63 that is an arithmetic processor apparatus are transferred through the light-emitting element 67 to the light-emitting surface 72, and the semiconductor chips 64 and 66 receive the signals transmitted from the light-emitting surface 72 at their respective light-receiving elements 68 and 69. As a result, the clock signals are taken into the storage apparatuses 64 and 65 from the light-emitting surface 72.

Signals other than the clock signals may be transferred by wiring patterns that may be formed on the system substrate 71, or on the light-emitting surface 72 if such a film is formed on the system substrate 71, for example.

Accordingly, this embodiment also provides effects similar to those provided by the fourth embodiment. Also, in the semiconductor device of the present embodiment, the light-emitting surface 72 is formed on the entire area of the system substrate 71. Therefore, when semiconductor chips are mounted on the system substrate 71, mounting locations of the semiconductor chips do not need particular consideration. In contrast, particular consideration is required when glass fibers are disposed.

It is noted that the fifth embodiment is described with reference to the case where the light-emitting surface 72 is formed over the entire area of the system substrate 71. However, the present invention is not limited to such an embodiment. The light-emitting surface 72 may be formed only in a limited area in the system substrate 71, for example, in an area where the semiconductor chips are formed.

Also, a plurality of light-emitting surfaces 72 may be formed in layers, and signals are allocated to each of the layers, such that not only the clock signals but also other signals, such as, for example, enable signals may be transferred. In this case, for example, a light prevention film may be formed between the adjacent light-emitting surfaces not only to prevent external light from coming into the light-emitting surfaces but also to prevent optical signals of one light-emitting surface from coming into the other light-emitting surface. Also, the light-receiving elements and the light-emitting elements may be formed in such a manner that signals are transmitted only to the corresponding light-emitting surface or signals are received only from the corresponding light-emitting surface, and that optical signals are not transferred to the non-corresponding light-emitting surface and optical signals are not received from the non-corresponding light-emitting surface.

It is noted that the present invention is not limited to the embodiments described above, and a variety of modifications can be implemented.

What is claimed is:

1. A semiconductor device, comprising:

a semiconductor chip and a light-receiving element formed on the semiconductor chip for receiving an optical signal, wherein the semiconductor chip is disposed in a first plane; and an optical signal transfer device that directly contacts the light-receiving element for transferring the optical signal from an arithmetic processing apparatus into the semiconductor chip, wherein the optical signal transfer device is disposed in a second plane that is spaced apart from the first plane, wherein the optical signal transfer device is embedded in a mounting substrate on which the semiconductor chip is mounted, wherein the light-receiving element is formed in a cylindrical shape on the semiconductor chip on a side thereof that is opposite to the mounting substrate, and the light-receiving element is inserted in contact holes and bonded to the optical signal transfer device to thereby connect the light-receiving element to the optical signal transfer device.

2. A semiconductor device, comprising:

a semiconductor chip and a light-receiving element formed on the semiconductor chip for receiving an optical signal; and an optical signal transfer device connected to the light-receiving element for transferring an electrical signal from an arithmetic processing apparatus as an optical signal into the semiconductor chip, wherein the optical signal transfer device is a light-emitting surface that is formed in a mounting substrate, wherein the light-receiving element is formed in a cylindrical shape on the semiconductor chip on a side thereof that is opposite to the mounting substrate, and the light-receiving element is inserted in contact holes and bonded to the optical signal transfer device to thereby connect the light-receiving element to the optical signal transfer device.

3. A semiconductor device, comprising:

a mounting substrate;

at least one optical signal transfer device embedded in the mounting substrate, wherein the at least one optical signal transfer device is adapted to transfer an optical signal;

a plurality of semiconductor chips mounted on the mounting substrate; and a light-receiving element formed in at least one of the semiconductor chips and that is connected to the optical signal transfer device for receiving the optical signal, wherein the optical signal is transferred among the plurality of semiconductor chips through the optical signal transfer device, wherein the optical signal transfer device is formed in a lattice configuration and embedded in the mounting substrate, wherein the light-receiving element is formed in a cylindrical shape on the semiconductor chip on a side thereof that is opposite to the mounting substrate, and the light-receiving element is inserted in contact holes and bonded to the optical signal transfer device to thereby connect the light-receiving element to the optical signal transfer device.

* * * * *